(12) United States Patent
Bruneau et al.

(10) Patent No.: US 12,237,753 B2
(45) Date of Patent: Feb. 25, 2025

(54) DRIVE UNIT FOR ELECTRIC VEHICLE

(71) Applicant: Taiga Motors Inc., Lasalle (CA)

(72) Inventors: Samuel Bruneau, Montreal (CA); Paul Bruneau, Montreal (CA)

(73) Assignee: Taiga Motors Inc., Lasalle (CA)

( * ) Notice: Subject to any disclaimer, the term of this patent is extended or adjusted under 35 U.S.C. 154(b) by 363 days.

(21) Appl. No.: 17/569,834

(22) Filed: Jan. 6, 2022

(65) Prior Publication Data
US 2022/0224207 A1 Jul. 14, 2022

Related U.S. Application Data

(60) Provisional application No. 63/135,466, filed on Jan. 8, 2021, provisional application No. 63/135,474, filed on Jan. 8, 2021.

(51) Int. Cl.
| | |
|---|---|
| *H02K 9/19* | (2006.01) |
| *H02K 5/20* | (2006.01) |
| *H02K 9/00* | (2006.01) |
| *H02K 9/22* | (2006.01) |
| *H02K 11/33* | (2016.01) |
| *H02P 27/06* | (2006.01) |
| *B60K 1/00* | (2006.01) |
| *B60K 1/04* | (2019.01) |
| *B60L 15/20* | (2006.01) |
| *B60W 10/08* | (2006.01) |
| *B62M 27/02* | (2006.01) |

(Continued)

(52) U.S. Cl.
CPC ............... *H02K 9/19* (2013.01); *H02K 5/203* (2021.01); *H02K 9/00* (2013.01); *H02K 9/22* (2013.01); *H02K 9/227* (2021.01); *H02K 11/33* (2016.01); *H02P 27/06* (2013.01); *B60K 1/00* (2013.01); *B60K 2001/006* (2013.01); *B60K 1/04* (2013.01); *B60L 15/20* (2013.01); *B60W 10/08* (2013.01); *B62M 27/02* (2013.01); *H02K 5/225* (2013.01); *H02K 11/0094* (2013.01); *H02K 16/02* (2013.01)

(58) Field of Classification Search
CPC .................................. B60K 1/00; B60K 1/04
See application file for complete search history.

(56) References Cited

U.S. PATENT DOCUMENTS

| | | |
|---|---|---|
| 6,181,590 B1 | 1/2001 | Yamane et al. |
| 9,000,631 B2 | 4/2015 | Prix |

(Continued)

FOREIGN PATENT DOCUMENTS

| | | |
|---|---|---|
| CN | 206472074 | 9/2017 |
| CN | 207074936 | 3/2018 |

(Continued)

*Primary Examiner* — Brian L Swenson
(74) *Attorney, Agent, or Firm* — Dicke, Billig & Czaja, PLLC

(57) ABSTRACT

Drive units for electric vehicles are provided. One example provides a drive unit for an electric vehicle including a housing having a first compartment and a second compartment separated from one another by a shared wall, an electrical inverter disposed within the first compartment and having a set of electrical output terminals, and an electric motor disposed within the second compartment and having electrical input terminals electrically coupled to the output terminals via one or more openings extending through the shared wall.

18 Claims, 14 Drawing Sheets

(51) Int. Cl.
*H02K 5/22* (2006.01)
*H02K 11/00* (2016.01)
*H02K 16/02* (2006.01)

(56) References Cited

U.S. PATENT DOCUMENTS

| | | |
|---|---|---|
| 10,362,701 B2 | 7/2019 | Sakai |
| 2001/0012212 A1 | 8/2001 | Ikeda |
| 2009/0040724 A1 | 2/2009 | Nishikimi et al. |
| 2010/0013331 A1 | 1/2010 | Yoshida et al. |
| 2011/0211980 A1 | 9/2011 | Shibuya et al. |
| 2011/0261588 A1 | 10/2011 | Hattori et al. |
| 2012/0250384 A1 | 10/2012 | Ito et al. |
| 2015/0199376 A1 | 7/2015 | Matsuo |
| 2016/0157391 A1 | 6/2016 | Huang et al. |
| 2017/0294821 A1 | 10/2017 | Shimizu et al. |
| 2018/0159403 A1 | 6/2018 | Yokoyama et al. |
| 2018/0287452 A1 | 10/2018 | Kim et al. |
| 2019/0199160 A1 | 6/2019 | Okuhata et al. |
| 2020/0140037 A1 | 5/2020 | Haavikko et al. |
| 2020/0212755 A1 | 7/2020 | Okuhata et al. |
| 2020/0280238 A1 | 9/2020 | Zhu et al. |
| 2020/0290451 A1 | 9/2020 | Van Seventer |
| 2021/0257883 A1 | 8/2021 | Kim et al. |
| 2022/0009589 A1 | 1/2022 | Matsushita |
| 2022/0017181 A1 | 1/2022 | Suzuki et al. |
| 2022/0063764 A1 | 3/2022 | Matsushita |
| 2022/0111929 A1 | 4/2022 | Matsushita |
| 2022/0311236 A1* | 9/2022 | Bernatchez ......... B60L 15/2018 |
| 2023/0081226 A1* | 3/2023 | Connors ............. H01M 50/244 180/68.5 |

FOREIGN PATENT DOCUMENTS

| | | |
|---|---|---|
| DE | 10 2019 207 445 | 11/2020 |
| JP | 2012-210000 | 10/2012 |
| JP | 5889643 | 3/2016 |
| JP | 6365209 | 8/2018 |
| KR | 102010301 | 8/2019 |
| WO | 2021/084520 | 5/2021 |

* cited by examiner

DRIVE UNIT FOR ELECTRIC VEHICLE

CROSS-REFERENCE TO RELATED APPLICATIONS

This application claims priority from U.S. Provisional Patent Application No. 63/135,466, filed Jan. 8, 2021, and U.S. Provisional Patent Application No. 63/135,474, filed Jan. 8, 2021, which are incorporated by reference in their entirety herein.

TECHNICAL FIELD

The present disclosure relates generally to electric vehicles and, in particular embodiments, to powertrain components of electric vehicles.

BACKGROUND

Electric powertrains of electric vehicles, including electric powersport vehicles (e.g., all-terrain vehicles (ATVs), personal watercraft (PWC), and snowmobiles), typically include a battery system, one or more electrical motors, each with a corresponding electronic power inverter (sometimes referred to as a motor controller), and various auxiliary systems (e.g., cooling systems). Efficiencies in size, weight, and energy consumption of system components improve vehicle performance (e.g., responsiveness, range, and reliability) and cost, particularly for electric powersport vehicles where space and weight are at a premium.

SUMMARY

Some embodiments of the present disclosure relate to a drive unit housing that houses both an electrical inverter and an electric motor. Optionally, the drive unit housing may include a shared wall the separates the electrical inverter and the electric motor into different compartments. Advantageously, the drive unit housing may provide space-efficient packaging for the electrical inverter and electric motor, and may also improve performance by reducing the length of electrical connections between the electrical inverter and electric motor.

One example provides a drive unit for an electric vehicle including a housing having a first compartment and a second compartment separated from one another by a shared wall, an electrical inverter disposed within the first compartment and having a set of electrical output terminals, and an electric motor disposed within the second compartment and having electrical input terminals electrically coupled to the output terminals via one or more openings extending through the shared wall.

According to one example of the present disclosure, a drive unit for an electric vehicle is provided. The drive unit includes a housing having a first compartment and a second compartment separated from one another by a shared wall. The drive unit also includes an electrical inverter disposed within the first compartment and having a set of electrical output terminals, and an electric motor disposed within the second compartment and having electrical input terminals electrically coupled to the output terminals via one or more openings extending through the shared wall.

In some examples, the input terminals of the electric motor include electrical leads extending through the one or more openings into the first compartment.

In some examples, a perimeter of the housing is confined within a generally longitudinal form factor, the first and second compartments being disposed axially to one another along a longitudinal axis of the longitudinal form factor. The longitudinal form factor may be generally cylindrical in shape. The electrical inverter may include a set of solid-state switches providing electrical power to the electrical output terminals, the switches and output terminals disposed within the first compartment such that the set of output terminals axially aligns with the electrical input terminals of the electric motor to reduce conductor lengths between the electric motor and the set of solid-state switches. Optionally, the electrical output terminals are arrayed along an arc to axially align with the electrical input terminals. The electrical inverter may also or instead include a set of capacitors to receive DC power from a battery source, the capacitors offset in a radial direction of the longitudinal form factor from the set of solid-state switches.

According to one example, a drive unit housing for an electric vehicle is provided. The housing includes a first housing section defining a first compartment to house an electrical inverter and a second housing section defining a second compartment to house an electric motor. The first and second housing sections are separably coupled to one another with the first and second compartments separated by a shared wall.

In some examples, perimeters of the first and second housing sections are confined within a generally longitudinal form factor with the first and second housing sections being disposed axially to one another along a longitudinal axis of the longitudinal form factor. The longitudinal axis of the longitudinal form factor may be aligned with an axis of a rotor shaft of the electric motor when disposed within the second compartment.

In some examples, the first housing section includes a substantially tubular perimeter casing defining a circumference of the first compartment and having first and second open ends. The shared wall may be coupled to and closing the first open end. The first housing section may also or instead include a cover plate separably coupled to the tubular perimeter casing to cover the second open end. Optionally, the shared wall and the tubular perimeter casing comprise a contiguous, integrated piece. The cover plate may include electrical terminals for connection to the electrical inverter from a battery system.

In some examples, the second housing section includes a substantially tubular perimeter casing defining a circumference of the second compartment and having first and second open ends and a cover plate coupled to and closing the first end. Optionally, the shared wall closes the second end when the tubular perimeter casing is coupled thereto.

In some examples, the shared wall includes a bearing pocket on a side facing the second compartment to receive an end of a rotor shaft of the electric motor.

In some examples, the first compartment includes a first compartment portion to house capacitors of the electrical inverter and a second compartment portion to house power switching and control electronics of the electrical inverter.

In some examples, the shared wall includes one or more openings extending there through to provide electrical connection of the electric motor to the electrical inverter. Electrical power leads from a stator of the electric motor may pass through the one or more openings from the second compartment to the first compartment.

According to one example of the present disclosure, an electric vehicle is provided. The electric vehicle includes a battery system, an electrical inverter electrically coupled to the battery system, an electric motor, electrically coupled to the power inverter, to propel the electric vehicle, and a housing having a first compartment to house the power inverter and a second compartment to house the electric motor, the first compartment and second compartment being separated by a shared wall.

Some embodiments of the present disclosure provide a drive unit defining fluid pathways to circulate a fluid to cool an electrical inverter and/or an electric motor. The fluid pathways may be integrally formed within the drive unit, such that they do not extend outside of a perimeter of the drive unit. For example, the fluid pathways may be formed in a shared wall separating different compartments of the drive unit, in outer sidewalls of a housing of the drive unit and/or in a rotor shaft of the electric motor. In this way, the fluid pathways may efficiently cool the drive unit without significantly increasing its overall footprint.

One example provides a drive unit housing for an electric vehicle including a first housing section having perimeter sidewalls forming a first compartment to house an electrical inverter, and a second housing section having perimeter sidewalls forming a second compartment to house an electric motor. The first compartment is separated from the second compartment by a shared wall, the shared wall including fluid pathways to circulate fluid to cool the electrical inverter and the perimeter sidewalls of the second housing section including fluid pathways to circulate fluid to cool the electric motor.

According to one example, a drive unit housing for an electric vehicle is provided. The housing includes a first housing section forming a first compartment to house an electrical inverter, a second housing section forming a second compartment to house an electric motor, an inlet port to receive a fluid, a shared wall separating the first compartment and the second compartment, the shared wall defining fluid pathways in fluid communication with the inlet port to circulate the fluid to cool the electrical inverter, and an outlet port in fluid communication with the fluid pathways to discharge the fluid.

In some examples, the fluid pathways of the shared wall are first fluid pathways, and the second housing section includes perimeter sidewalls defining second fluid pathways in fluid communication with the inlet port to circulate the fluid to cool the electric motor. The first fluid pathways of the shared wall may be disposed in series with the second fluid pathways of the perimeter sidewalls of the second housing section between the inlet port and the outlet port. Optionally, the first fluid pathways and the second fluid pathways may form a continuous fluid pathway between the inlet port and the outlet port. The continuous fluid pathway may be contained within a longitudinal form factor defined by a perimeter of the drive unit housing.

In some examples, the perimeter sidewalls of the second housing section include a cylindrical housing extending about a perimeter of a stator of the electric motor, the second fluid pathways extending about a circumference of the cylindrical housing. The second fluid pathways may extend in a spiral about the circumference of the cylindrical housing.

In some examples, the electric motor includes a hollow rotor shaft defining third fluid pathways in fluid communication with the input port to circulate the fluid to cool the electric motor. The first fluid pathways of the shared wall and the second fluid pathways of the perimeter sidewalls may be disposed in series with the third fluid pathways of the hollow rotor shaft. Optionally, the first fluid pathways, the second fluid pathways and the third fluid pathways form a continuous fluid pathway between the inlet port and the outlet port.

In some examples, the shared wall defines a bearing pocket in which an end of the hollow rotor shaft is disposed. The shared wall may include a tube extending from the bearing pocket to be received within the end of the hollow rotor shaft, the tube and the end of the hollow rotor shaft forming at least part of the third fluid pathways.

In some examples, a perimeter of the drive unit housing is confined within a generally longitudinal form factor, the first and second compartments being disposed axially to one another along a longitudinal axis of the longitudinal form factor. The longitudinal form factor may be generally cylindrical in shape and/or the shared wall may be generally circular in shape. The inlet port and the outlet port being confined within the generally longitudinal form factor. For example, the first housing section may define a first recess in which the inlet port is disposed and/or define a second recess in which the outlet port is disposed.

In some examples, the electrical inverter includes a capacitor mounted to the shared wall, the fluid pathways arranged so as to first pass the capacitor downstream of the inlet port.

In some examples, the first housing section is separable from the second housing section.

According to one example of the present disclosure, the is provided a drive unit for an electric vehicle. The drive unit includes an electrical inverter, an electric motor electrically coupled to the electrical inverter, and a housing. The housing includes a first housing section having perimeter sidewalls forming a first compartment to house the electrical inverter, a second housing section having perimeter sidewalls forming a second compartment to house the electric motor, the first and second compartments separated from one another by a shared wall, and a continuous fluid pathway extending through the first and second housing sections to circulate fluid to cool the electrical inverter and the electric motor.

According to one example of the present disclosure, there is provided a method of cooling a drive unit for an electric vehicle. The drive unit may include an electrical inverter, an electric motor and a housing in which the electrical inverter and the electric motor are disposed. The method includes receiving a fluid via an inlet port of the housing, circulating the fluid through fluid pathways formed in a shared wall of the housing to cool the electrical inverter, the shared wall separating a first compartment of the housing in which the electrical inverter is disposed and a second compartment of the housing in which the electric motor is disposed, and discharging the fluid via an outlet port of the housing.

In some examples, the fluid pathways are first fluid pathways, the method including circulating the fluid through second fluid pathways formed in a perimeter sidewall of the housing to cool the electric motor.

Additional and/or alternative features and aspects of examples of the present technology will become apparent from the following description and the accompanying drawings.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense. It is to be understood that features of the various examples described herein may be combined, in part or whole, with each other, unless specifically noted otherwise.

Electric powertrains for electric vehicles, including electric powersport vehicles (e.g., motorcycles, all-terrain vehicles (ATVs), personal watercraft (PWC), (e.g., side-by-side) utility task vehicles (UTVs) and snowmobiles), typically include a battery system, one or more electrical motors, each with a corresponding electronic power inverter (sometimes referred to as a motor controller), and various auxiliary systems (e.g., cooling systems). Efficiencies in size, weight, and energy consumption of system components improve vehicle performance (e.g., responsiveness, range, and reliability) and cost, particularly for electric powersport vehicles where space and weight are at a premium.

Figure 1:
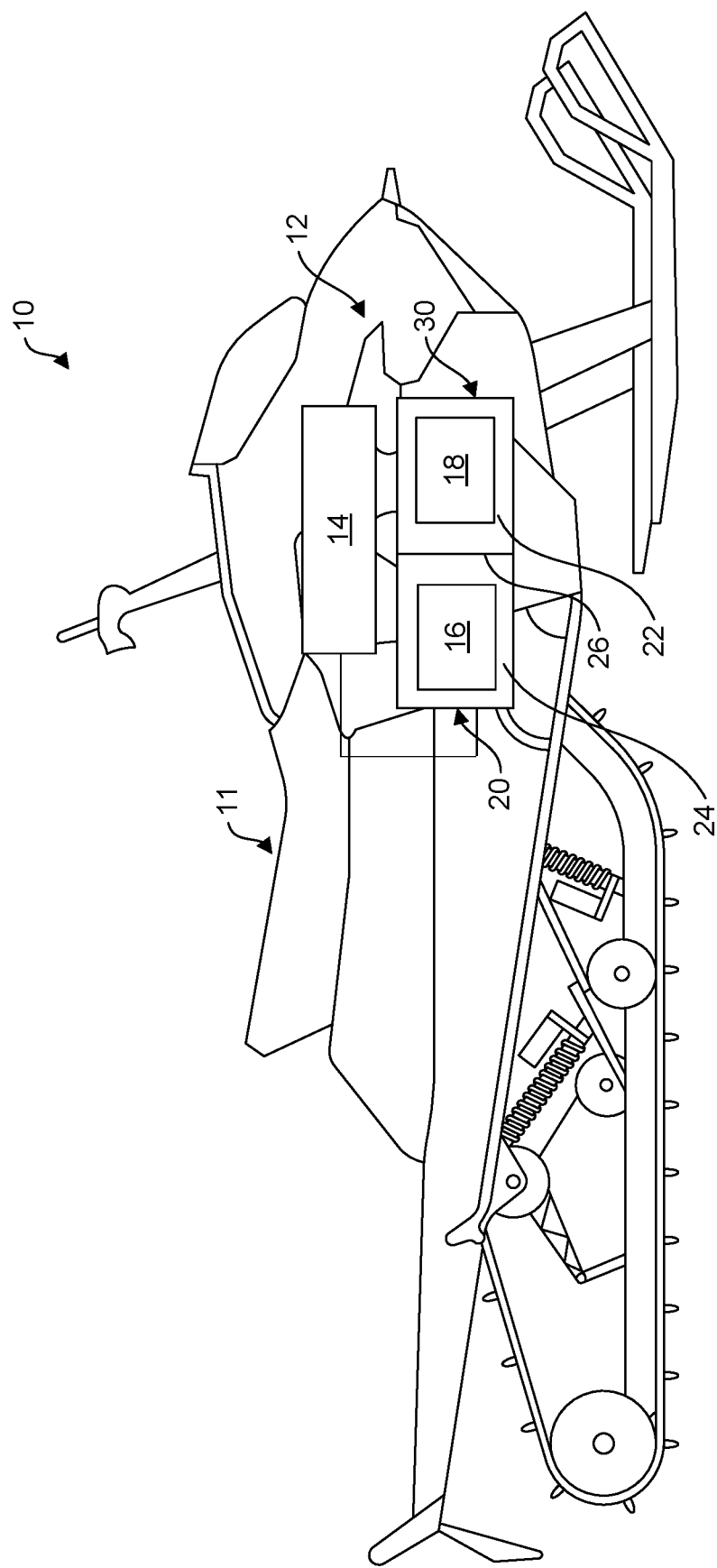
FIG. 1 illustrates an electric vehicle, in particular, an electric power sport vehicle, including a drive unit in accordance with one example of the present disclosure.

FIG. 1 generally illustrates an electric vehicle 10 including an electric drive unit 30, in accordance with examples of the present disclosure. Although illustrated as a snowmobile for example purposes, electric vehicle 10 could be other types of electric vehicles, including other types of powersport vehicles such as personal watercraft (PWC) and side-by-side vehicles. Electric vehicle 10 includes a seat 11, which is shown as a straddle-seat, to accommodate an operator of electric vehicle 10. Electric vehicle 10 employs an electric powertrain 12 including a battery system 14, an electric motor 16, and an electronic power inverter 18 for controlling electric motor 16. Powertrain 12 is configured to propel the electric vehicle by driving one or more wheels (e.g., in the case of a motorcycle, ATV or UTV), by driving an endless track (e.g., in the case of a snowmobile) or by driving a propeller or impeller (e.g., in the case of a PWC).

In some examples, electric motor 16 may be a permanent magnet synchronous motor. Electric motor 16 may have a power output of between 120 and 180 horsepower. Alternatively, electric motor 16 may have a maximum output power of greater than 180 horsepower. In some examples, battery system 14 may include a rechargeable multi-cell lithium ion or other type of battery. Battery system 14 may include multiple battery modules each including multiple battery cells. The battery cells may be pouch cells, cylindrical cells and/or prismatic cells, for example. The battery modules may be housed within a battery enclosure for protection from impacts, water and/or debris. In some examples, battery system 14 may be configured to output electric power at a voltage of between 300-400 volts, or up to 800 volts, for example.

According to one example of the present disclosure, as will be described in greater detail herein, drive unit 30 includes a housing having a first compartment 22 and a second compartment 24 separated from one another by a shared wall 26. In one example, as illustrated, inverter 18 is disposed in first compartment 22 and motor 16 is disposed in second compartment 24. Together, housing 20 with motor 16 and inverter 18 disposed therein form drive unit 30 for electric vehicle 10.

As will be described in greater detail below, by disposing motor 16 and inverter 18 together within housing 20, drive unit 30 provides a volumetrically efficient form factor (e.g., a generally longitudinal form factor, such as a cylindrical form factor, for instance) which consumes less space within electric vehicle 10. Additionally, drive unit 30 provides shortened electrical conductor lengths between output terminal of inverter 18 and input terminals of motor 16 which reduces electrical inductance and line losses (relative to separately housed motor-inverter combinations). Accordingly, drive unit 30, in accordance with the present disclosure, provides efficiencies in both space and performance relative to conventional, separately housed motor-inverter combinations.

Figure 2:
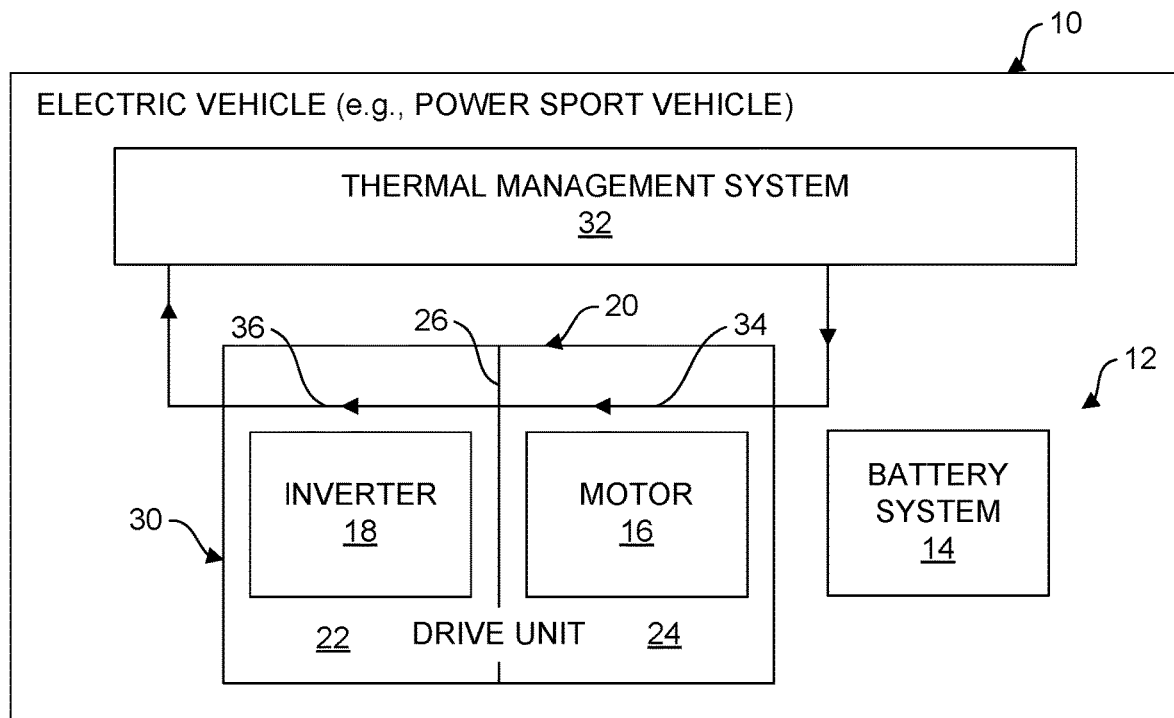
FIG. 2 is a block and schematic diagram illustrating an electric vehicle including a drive unit in accordance with the present disclosure.

FIG. 2 is a block and schematic diagram generally illustrating one example of electric vehicle 10, where, in addition to including electric powertrain 12 employing drive unit 30, electric vehicle 10 further includes a thermal management system 32. In one example, thermal management system 32 manages the temperatures (e.g., cooling) of electric powertrain 12 components, including battery system 14, motor 16, and inverter 18. Thermal management system 32 may be a closed-loop cooling system and/or an open-loop cooling system. The thermal management system 32 may utilize a liquid-to-liquid cooling system (e.g., in the case of a PWC), a snow-to-liquid cooling system (e.g., in the case of a snowmobile), an air-to-liquid cooling system (e.g., using a radiator), or a combination thereof. In accordance with examples of the present disclosure, as will be described in greater detail below, housing 20 of drive unit 30 includes a network of fluid circulation pathways 34 through which the thermal transfer fluid is circulated, as indicated arrows 36, to manage the temperatures of motor 16 and inverter 18.

Figure 3A:
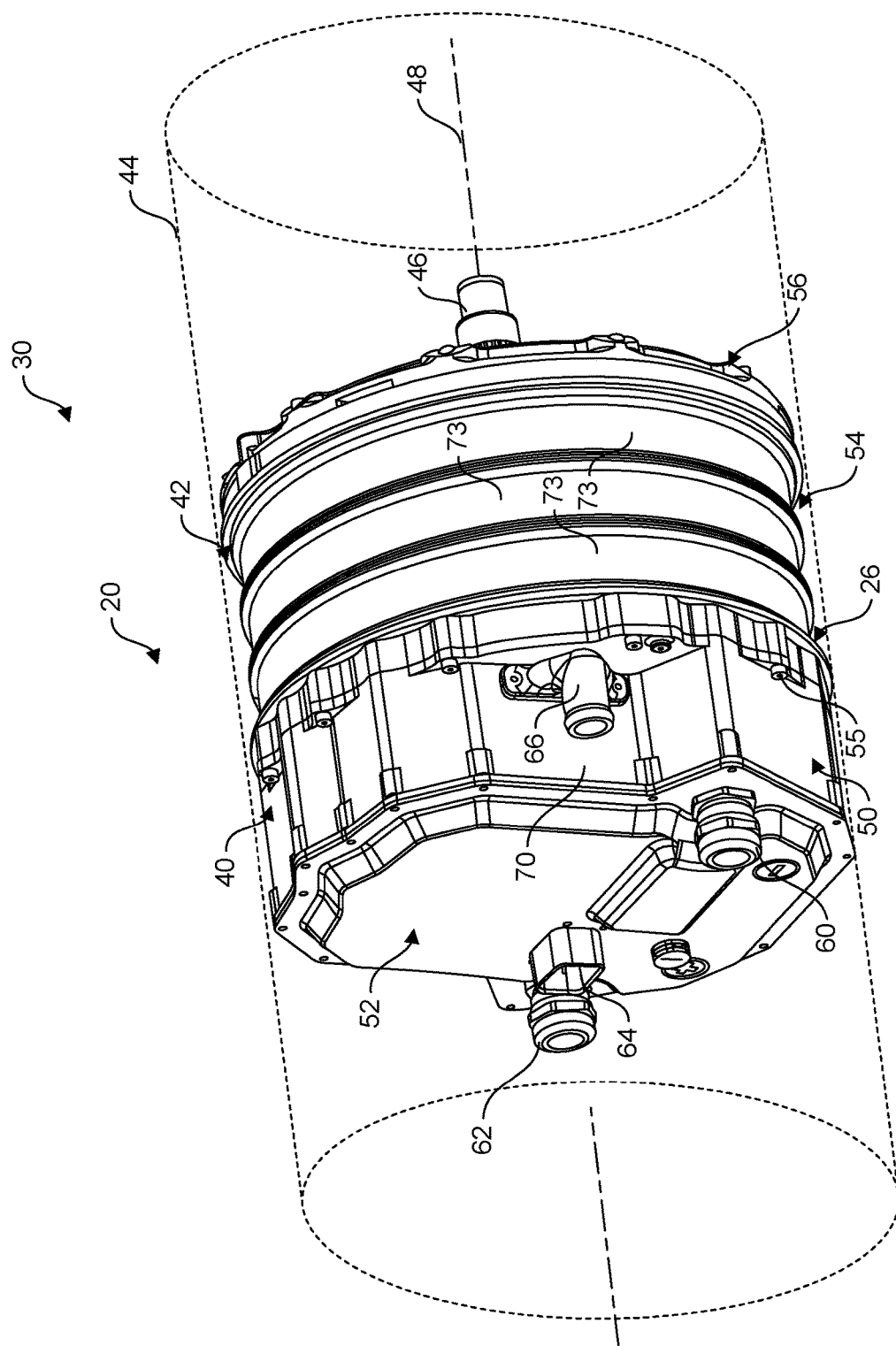
FIGS. 3A-3C are perspective views illustrating a drive unit, according to one example of the present disclosure.
Figure 3B:
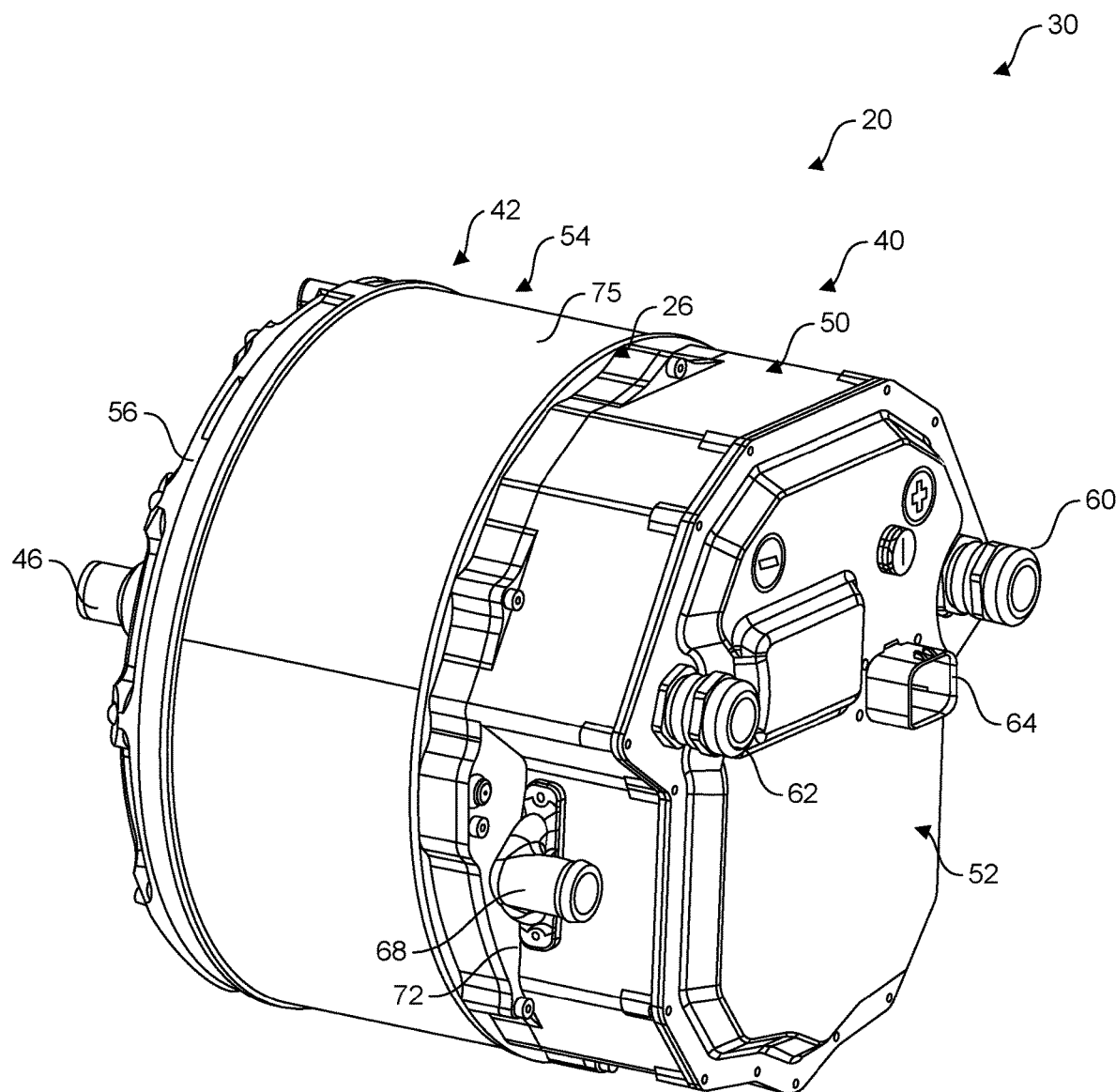
Figure 3C:
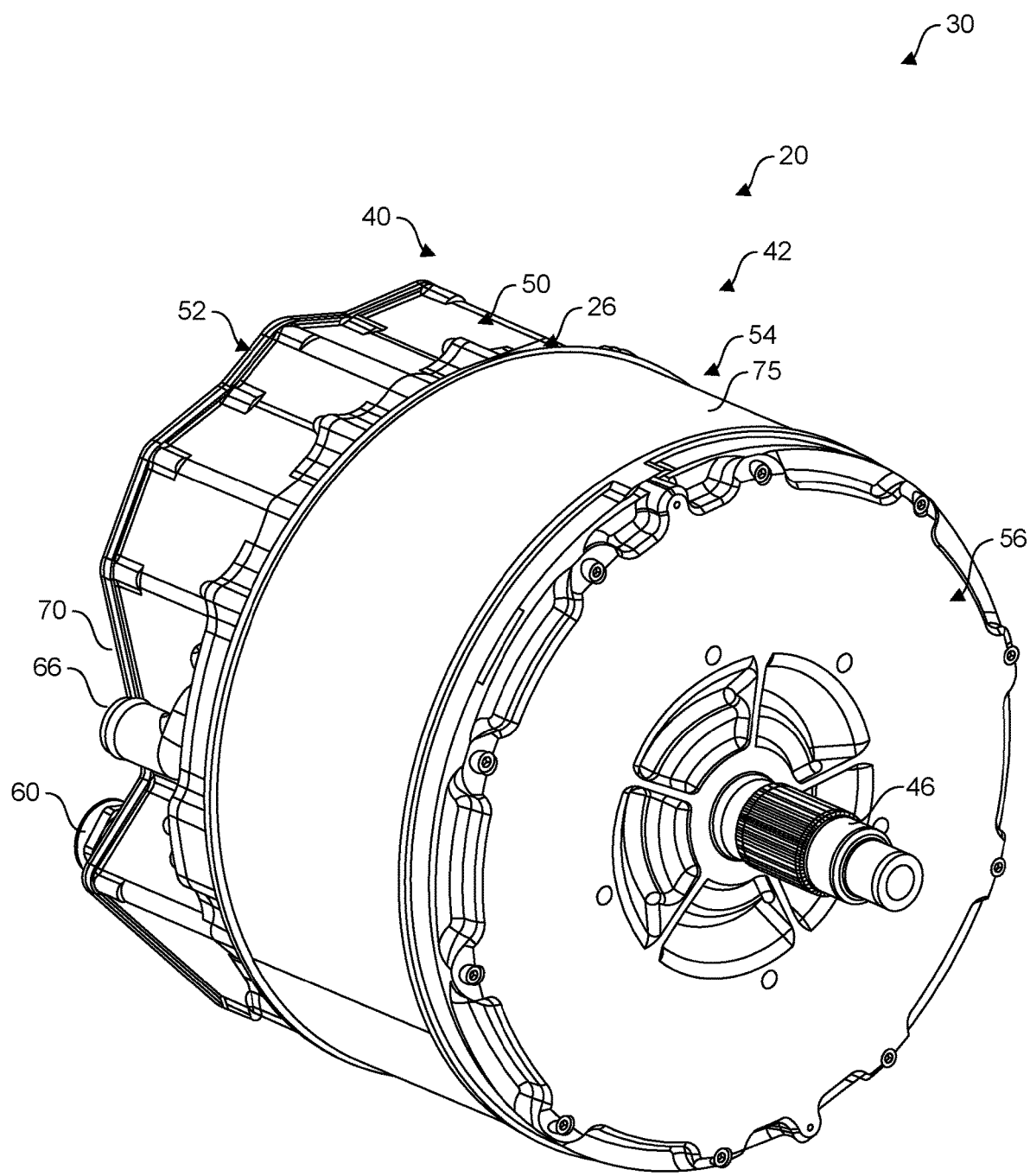
Figure 4:
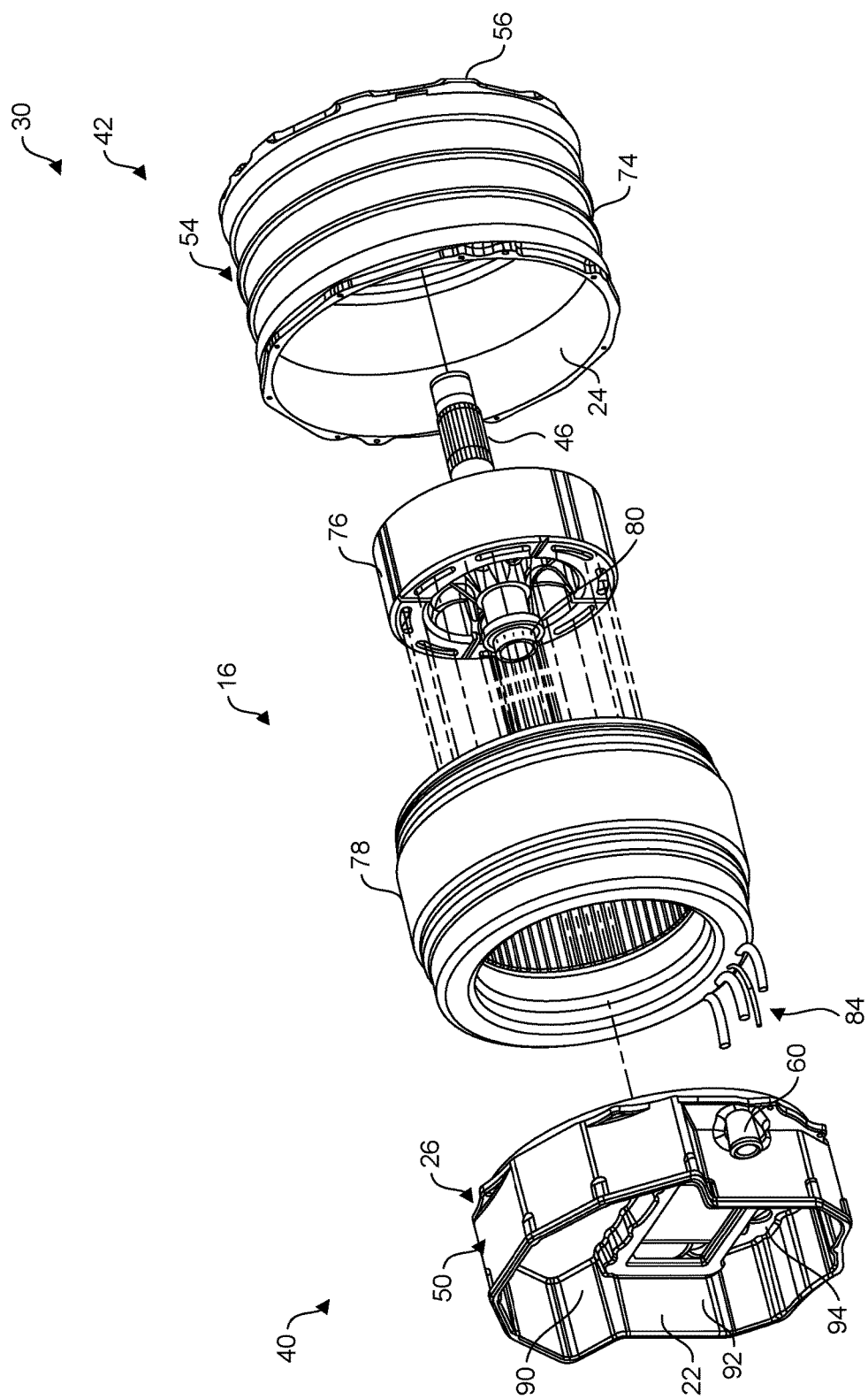
FIG. 4 is an exploded view illustrating portions of a drive unit, according to one example of the present disclosure.

FIGS. 3A-3C illustrate perspective views of drive unit 30, according to examples of the present disclosure. FIG. 4 is an exploded view illustrating portions of drive unit 30, according to one example. In some examples, housing 20 includes a first housing section 40 forming a first compartment 22 for housing inverter 18, and a second housing section 42 forming a second compartment 24 for housing electric motor 16. First and second housing sections 40 and 42 may each include at least some walls or other structural components of housing 20. While first and second housing sections 40 and 42 form first and second compartments 22 and 24, respectively, first and second housing sections 40 and 42 might not fully enclose first and second compartments 22 and 24.

In one example, a perimeter of housing 20 is confined within a generally longitudinal form factor 44 (graphically represented by dashed lines in FIG. 3A), where first and second housing sections 40 and 42, respectively forming first and second compartments 22 and 24, are disposed longitudinally relative to one another within the form factor. In one example, as illustrated, form factor 44 is generally cylindrical in shape with first and second housing sections 40 and 42 being disposed longitudinally relative to one another along a longitudinal axis 48 of generally cylindrical form factor 44. Shared wall 26 is generally circular in shape. In one example, longitudinal axis 48 of form factor 44 generally coincides with a longitudinal axis of a shaft 46 (i.e., a rotor shaft) of motor 16 (which extends from second housing section 42). In examples, as described below, first and second housing sections 40 and 42 are separable from one another.

In one example, first housing section 40 includes shared wall 26, which provides a base for first housing section 40 and which is disposed transversely to longitudinal axis 48 of form factor 44. Shared wall 26 may be integrally formed with first housing section 40. In one example, shared wall 26 is substantially circular in shape, but any suitable shape may be employed. First housing section 40 further includes a perimeter sidewall casing 50. In one example, as illustrated, perimeter sidewall casing 50 is ring- or band-shaped to form a generally tubular or circumferentially extending perimeter sidewall. In one example, the ring- or band-shaped perimeter sidewall casing 50 may be formed of a partial or continuous curved wall section, or may be formed from multiple straight wall sections extending from shared wall 26 that together form the ring- or band-shaped sidewall casing 50. In one example, perimeter sidewall casing 50 extends orthogonally from shared wall 26 and longitudinally relative to form factor 44, where shared wall 26 and circumferentially extending sidewall 50 together are generally can- or cup-shaped to form first compartment 22 for housing inverter 18. An end cover 52 is separably coupled to sidewall casing 50 to enclose first compartment 22.

In one example, second housing section 42 includes a perimeter sidewall casing 54 separably coupled to shared wall 26, such as via a number of fasteners 55 (e.g., screws or bolts) arranged about perimeter sidewall casing 50 of first housing section 40. In one example, perimeter sidewall casing 54 is ring- or tube-shaped to form a generally tubular or circumferentially extending perimeter sidewall. In one example, perimeter sidewall casing 54 extends orthogonally from shared wall 26 and longitudinally relative to form factor 44 with shared wall 26 serving as a base for second housing section 42, and with shared wall 26 and perimeter sidewall casing 54 together being drum-shaped to form second compartment 24 for housing motor 16. An end cover 56 is separably coupled to an end of perimeter sidewall casing 54 opposite shared wall 26 to enclose second compartment 24. Alternatively, end cover 56 may be integrally formed with sidewall casing 54 of the second housing section 42, such that the shared wall 26 acts as an endplate for enclosing the second compartment 24.

While shared wall 26 is described as being part of first housing section 40, in other examples, shared wall 26 may be part of second housing section 42. In other examples, shared wall 26 may be separable from both first and second housing sections 40 and 42.

In one example, end cover 52 includes positive and negative DC connection terminals 60 and 62 extending there through for electrical connection of capacitors of inverter 18 (see 120 in FIG. 7) to battery system 14 (see FIGS. 1 and 2).

Figure 7:
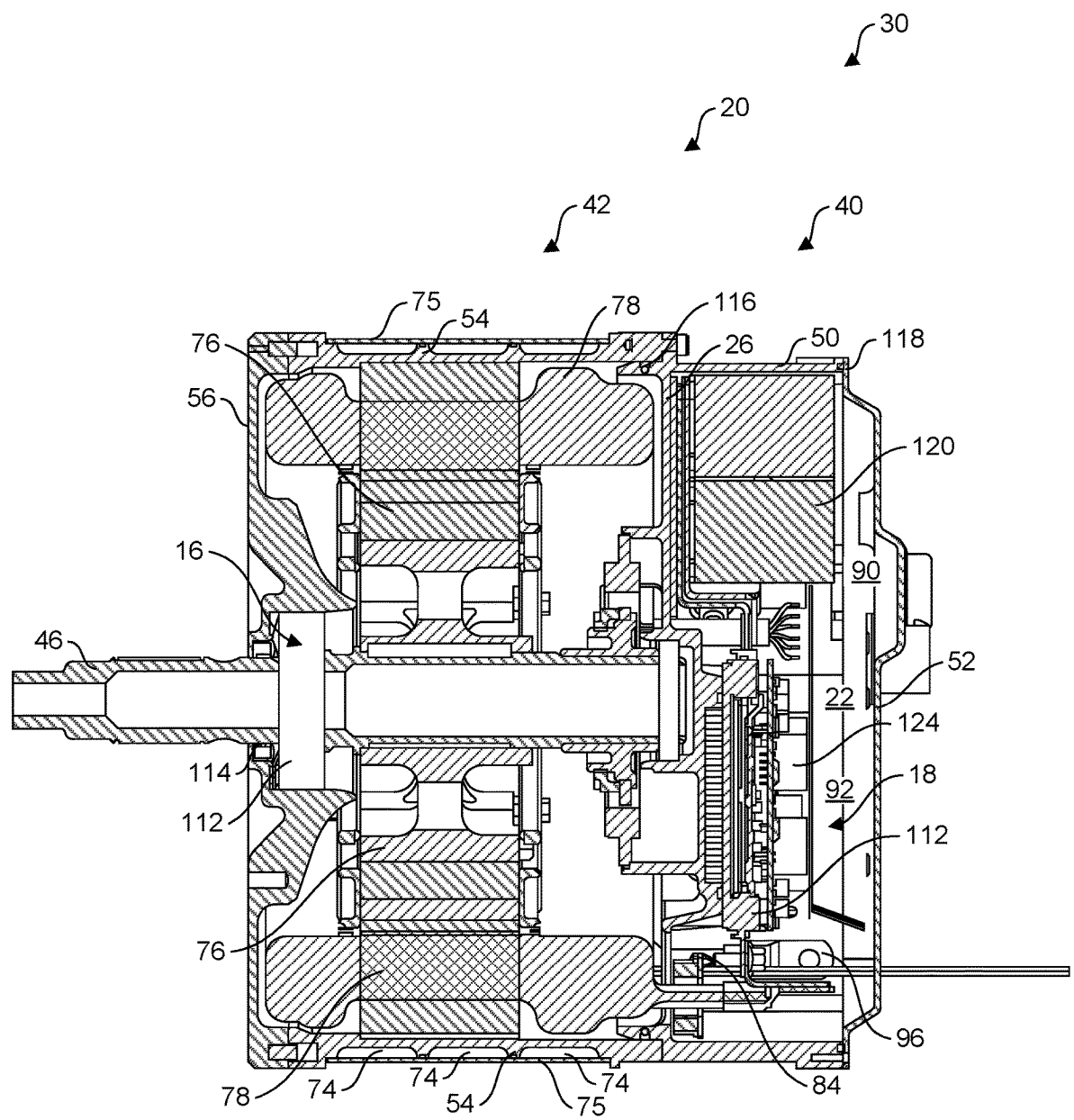
FIG. 7 is a cross-sectional view of a drive unit, according to one example of the present disclosure.

In one example, end cover 52 includes an electrical connector 64 for low voltage and control signal connection to control circuitry of inverter 18 (see 124 in FIG. 7).

In one example, as will be described in greater detail below, first housing section 40 respectively includes inlet and outlet fluid ports 66 and 68 (see FIG. 3B-3C) for connecting fluid pathways of thermal management system 32 to fluid pathways within housing 20 of drive unit 30 for cooling of motor 16 and inverter 18. Inlet 66 may receive a fluid from thermal management system 32, and outlet 68 may discharge the fluid back into thermal management system 32. It is noted that in other examples, inlet and outlet fluid ports 66 and 68 may be reversed, and that in other examples, more than one inlet and/or outlet port may be employed. In one example, as illustrated, sidewall casing 50 includes recesses 70 and 72 in which inlet and outlet fluid ports 66 and 68 are respectively disposed so that inlet and outlet fluid ports 66 and 68 are disposed within the confines of form factor 44.

In one example, as illustrated by FIG. 3A, a number of channels 73 extend circumferentially about sidewall casing 54 of second housing section 42. When a casing sleeve 75 is disposed about the circumference of sidewall casing 54, channels 73 become fluid pathways 74 (see FIG. 6) extending about the circumference of second housing section 42, where such fluid pathways 74 are part of the network of fluid pathways 34 through which fluid 36 is circulated by thermal management system 32 (see FIG. 2) to cool motor 16. In some examples, fluid pathways 74 may form a continuous spiral around sidewall casing 54. In other examples, fluid pathways 74 may be separate pathways disposed in parallel with one another. In other examples, fluid pathways 74 may be a continuous pathway employing a switchback configuration. Any number of suitable implementations may be employed.

Reference is now made to FIG. 4, which illustrates end cover 52 being removed from sidewall casing 50 of first housing section 40, and showing first and second housing compartments 22 and 24. Motor 16 includes a rotor 76 and a stator 78 which are disposed within second compartment 24 of second housing section 42. As will be described in greater detail below (see FIG. 9), an end 80 of shaft 46 facing shared wall 26 is hollow to enable circulation of thermal transfer fluid there through to cool motor 16. A set of electrical input leads 84 extend from stator 78 for connection to inverter 18 within compartment 22 of first housing section 40.

In one example, first compartment 22 of first housing section 40 includes a first compartment portion 90 for housing capacitors of inverter 18, and a second compartment portion 92 for housing electronic control and switching components (e.g., insulated-gate bipolar transistors (IGBTs)) of inverter 18 (see 122 and 124 in FIG. 7). In one example, a set of one or more openings 94 extend through shared wall 26 to enable electrical connection between input leads 84 of stator 78 and output terminals of inverter 18. In one example, input leads 84 from stator 78 extend through openings 94 into second compartment portion 92 for connection to output terminals of inverter 18. In other examples, output terminals of inverter 18 may extend through openings 94 into second housing section 42 for connection to input leads 84 of stator 78.

Figure 5:
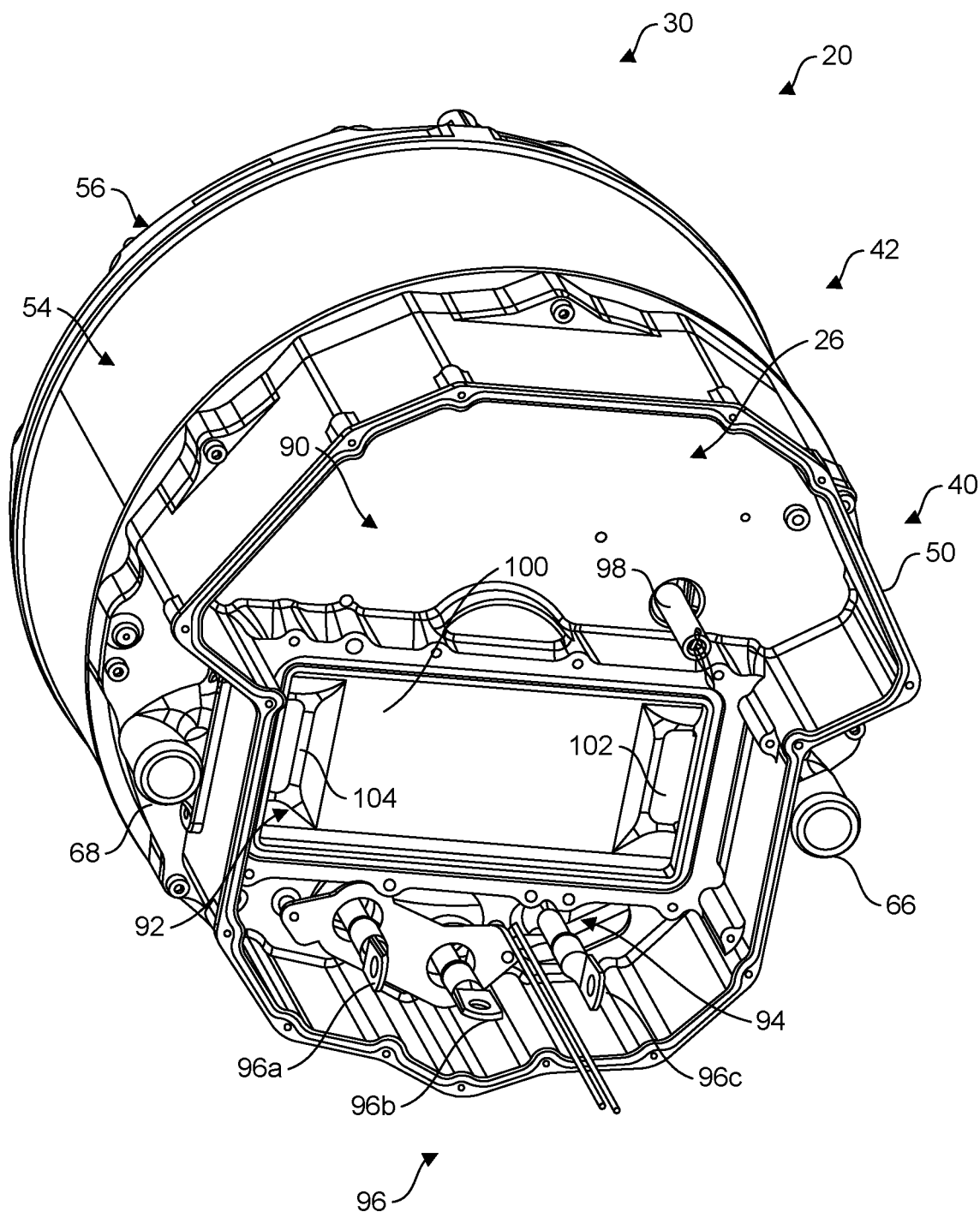
FIG. 5 is a perspective view illustrating portions of an inverter housing of a drive unit, according to one example of the present disclosure.

FIG. 5 is a perspective view illustrating first housing section 40 with end cover 52 removed. In one example, input power leads 84 of stator 78 extend through the set of openings 94 in shared wall 26 and terminate at a set of terminals 96 (illustrated as terminals 96a, 96b, and 96c) in second compartment portion 92. Sensor wiring 98 extends from motor 16 through shared wall 26 to inverter control electronics. By aligning the set of openings 94 through shared wall 26 (see also FIG. 8) with input leads 84 of stator 78 and with terminals 96, the lengths of conductor pathways between inverter 18 and stator 78 are reduced which, in-turn, reduces electrical inductances and power loss, thereby improving the electrical efficiency of drive unit 30.

As discussed in further detail elsewhere herein, housing 20 includes a network of fluid pathways 34 (also referred to as a fluid network) extending therethrough for cooling of motor 16 and inverter 18. In one example, in addition to inlet and outlet ports 66 and 68, fluid network 34 includes a fluid chamber 100 in shared wall 26 having a fluid inlet 102 and a fluid outlet 104 connecting fluid chamber 100 with other portions of the fluid network 34. It is noted that a cover over fluid chamber 100 is not shown in FIG. 5. In one example, a network of power switches (e.g., IGBTs) is mounted to shared wall 26 over fluid chamber 100 so as to be cooled by fluid circulated there through.

Figure 6:
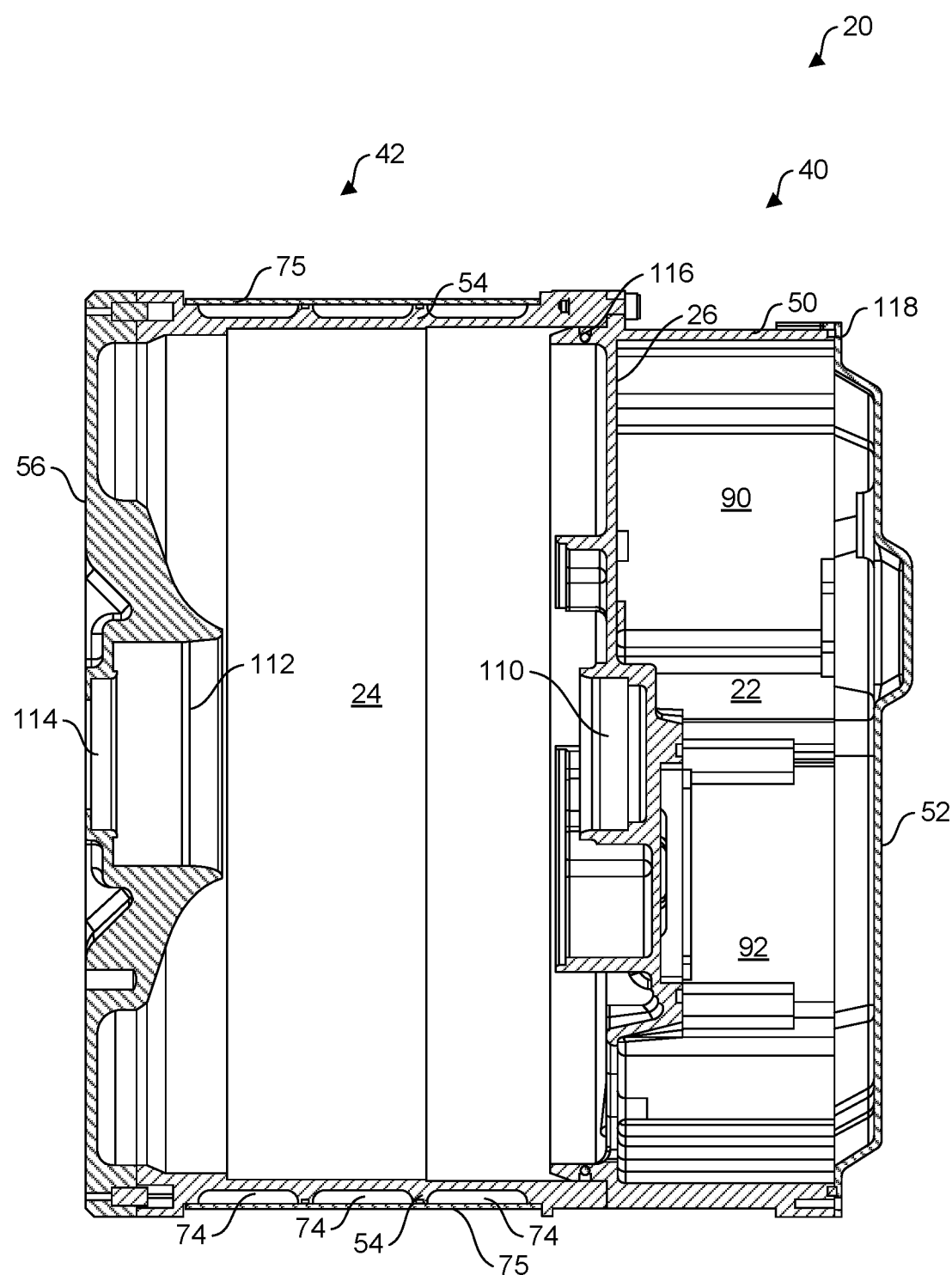
FIG. 6 is a cross-sectional view of a drive unit housing, according to one example of the present disclosure.

FIG. 6 is a cross-sectional view of housing 20, according to one example, where sidewall casing 50 of first housing section 40 contiguously and integrally extends from shared wall 26, and which together with end cover 52 forms first compartment 22. First compartment 22 includes first compartment portion 90 for housing capacitors of inverter 18, and second compartment portion 92 for housing control and switching electronics of inverter 18. In one example, shared wall 26 includes a bearing pocket 110 facing second compartment 24, where bearing pocket 110 is to receive end 80 of shaft 46 of electric motor 16 and through which thermal transfer fluid circulates, as described below.

Sidewall casing 54 and end cover 56 of second housing section 42 together with shared wall 26 form second compartment 24. End cover 56 includes a bearing pocket 112 to receive an opposing end of shaft 46 of motor 16 and an aperture 114 from which shaft 46 extends. Gaskets 116 and 118 respectively form seals between shared wall 26 and sidewall casing 54 to seal second compartment 24, and between end cover 52 and sidewall casing 50 to seal first compartment 22.

FIG. 7 is a cross-sectional view of drive unit 30, according to one example. DC capacitors 120 of inverter 18 are disposed in first compartment portion 90, while power switching network 122 and control electronics 124 of inverter 18 are disposed in second compartment portion 92. Input power leads 84 from stator 78 of motor 16 extend through shared wall 26 and terminate at terminals 96 in second compartment portion 92. Motor 16 is disposed within second compartment 24 with hollow end 80 of shaft 46 disposed within bearing pocket 110 of shared wall 26.

Figure 8:
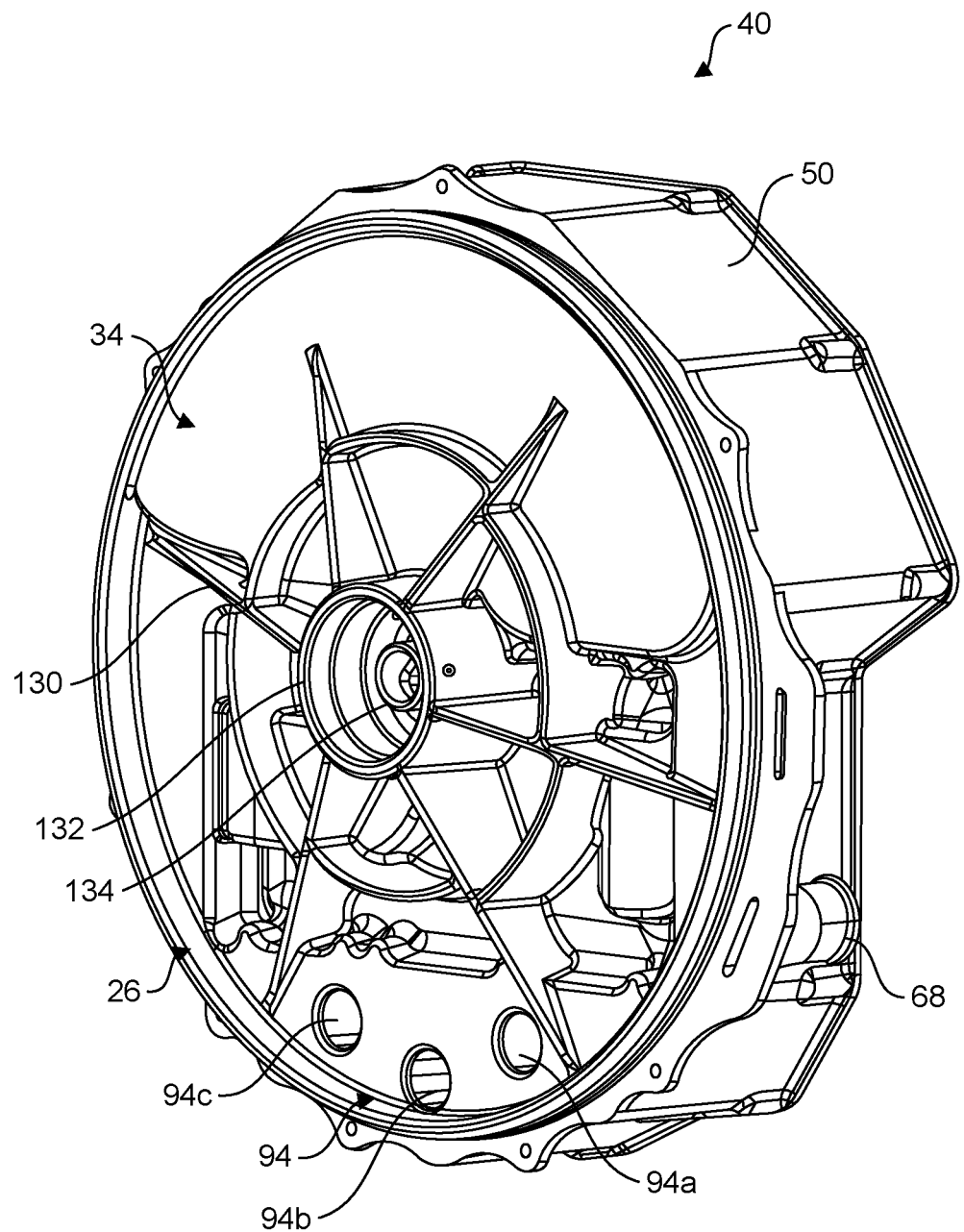
FIG. 8 is a perspective view illustrating portions of a shared wall of a drive unit housing, according to one example of the present disclosure.

FIG. 8 is a perspective view illustrating portions of first housing section 40 facing second (motor) compartment 24 including shared wall 26 and sidewall casing 50, according to one example. In one example, as illustrated, sidewall casing 50 contiguously extends from shared wall 26 such that shared wall 26 and sidewall casing 50 form a single base component for first housing section 40. A plurality of ribs, such as rib 130, extend from an inner surface of sidewall casing 50 to support a central hub 132 including bearing pocket 110 for supporting hollow end 80 of shaft 46 of motor 16. Also illustrated is the set of openings 94 through shared wall 26, illustrated as openings 94a-94c arrayed along an arc to align with input leads 84 of stator 78 (see FIG. 4). While three openings 94a-94c are shown in the Figures, this is exemplary only. In one example, shared wall 26 may include a single opening 94 for input leads 84 and terminals 96, or any other suitable number of openings 94.

In one example, end wall 26 includes a portion of the network of fluid pathways 34 through which a thermal transfer fluid is circulated to cool components of motor 16 and inverter 18. The network 34 of fluid pathways, which will be described in greater detail below (see FIG. 10) includes inlet and outlet ports 66 and 68, as well as fluid chamber 100 having inlet and outlet 102 and 104 (see FIG. 5). In one example, network 34 further includes a tube 134 which extends within hub 132 and, as will be described below (see FIG. 9), extends into hollow end 80 of shaft 46 to form inlet and outlet fluid pathways within shaft 46 to enable circulation of thermal transfer fluid therein to cool motor 16.

Figure 9:
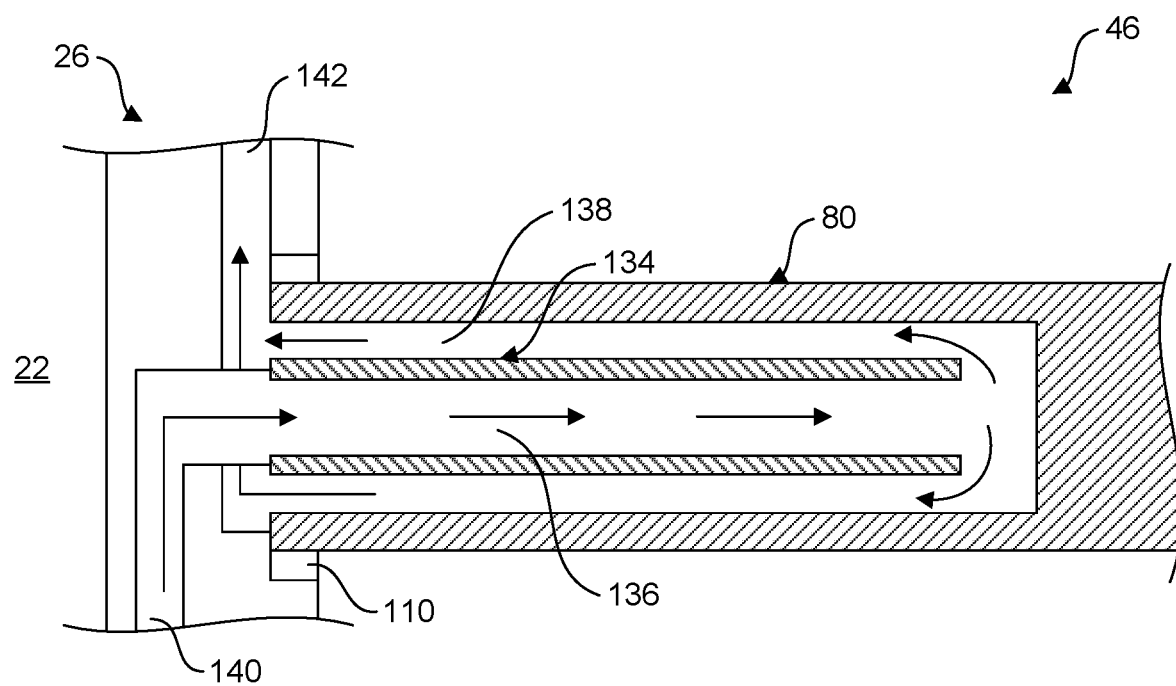
FIG. 9 is a schematic diagram illustrating a cross-sectional view of a hollow portion of a motor shaft, according to one example of the present disclosure.

FIG. 9 is a schematic diagram generally illustrating the circulation of thermal transfer fluid within hollow end 80 of shaft 46. As illustrated, tube 134 extends into hollow end 80 of shaft 46 from bearing pocket 110 (disposed within hub 132) to form an inlet fluid pathway 136 within tube 134, and an outlet fluid pathway 138 between the outer wall of tube 134 and inner wall of shaft 46. In this way, tube 134 and hollow end 80 of shaft 46 form fluid pathways in shaft 46. In one example, inlet and outlet fluid pathways 136 and 138 are respectively in fluid communication with fluid pathways 140 and 142 of the network of fluid pathways 34 (see FIG. 10 below).

Figure 10A:
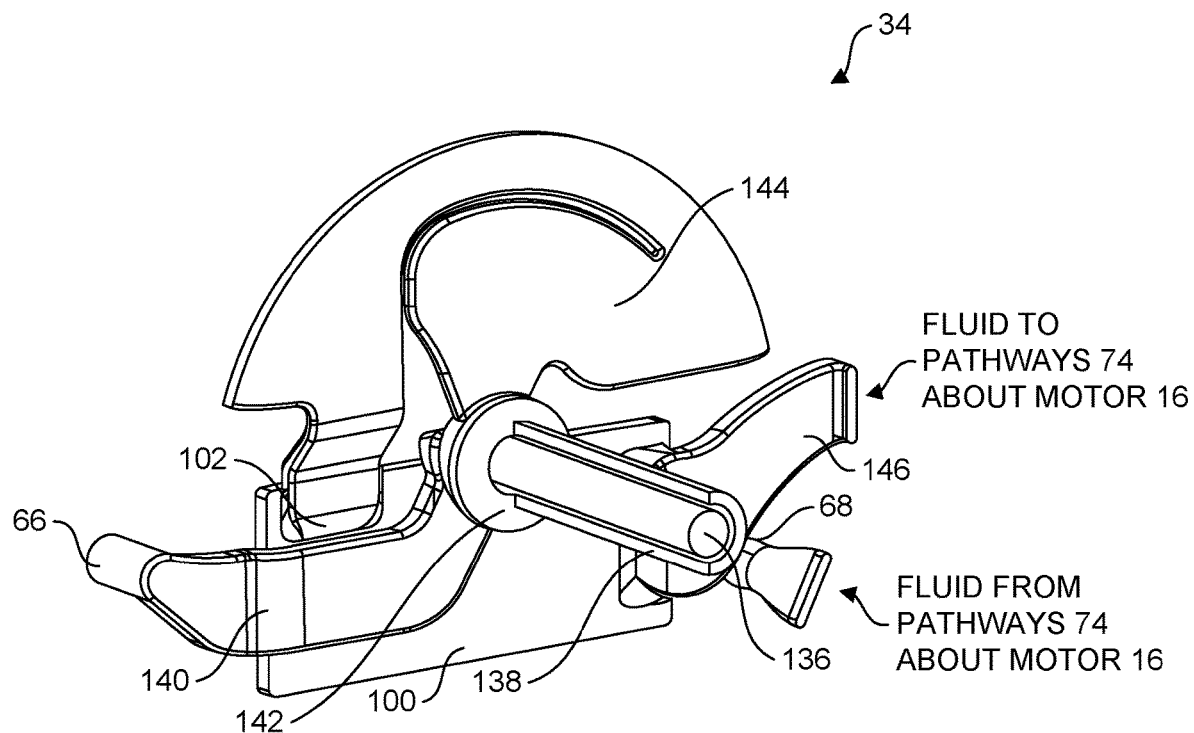
FIGS. 10A-10B are perspective views illustrating portions of a network of fluid circulation pathways for circulating a thermal transfer fluid through a drive unit, according to one example of the present disclosure.
Figure 10B:
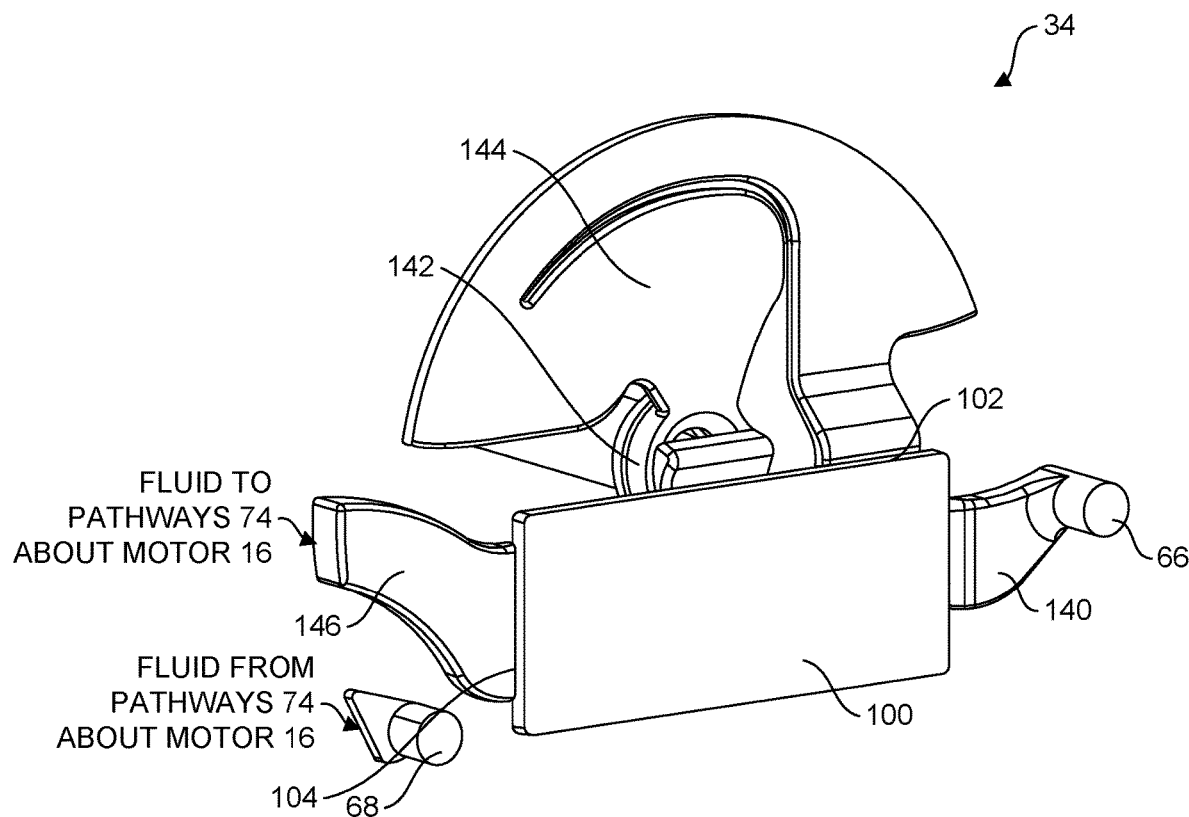

FIGS. 10A and 10B are perspective views illustrating portions of network 34 of fluid pathways, according to one example, for circulating thermal transfer fluid through housing 20 to cool components of motor 16 and inverter 18. FIGS. 10A and 10B illustrate network 34 as respectively viewed from second (motor) compartment 24 and first (inverter) compartment 22.

In one example, as illustrated, thermal transfer fluid is received via inlet port 66 and travels through pathways 140 to inlet fluid pathway 136 within tube 134 inside shaft 46 (see FIG. 9). Fluid then travels through outlet fluid pathway 138 and exits shaft 46 via fluid pathway 142, which is concentrically disposed about end 80 of shaft 46. Fluid then travels through a fluid pathway 144, which forms a fan-like, semicircular path along or within shared wall 26 proximate to first compartment portion 90 of first compartment 22 to cool DC capacitors 120 of inverter 18 (see FIG. 7).

Fluid then enters chamber 100 via inlet opening 102, where fluid within chamber 100 cools the power switching network 122 and control electronics 124 of inverter 18 disposed within second compartment portion 92 of first compartment 22 (see FIG. 7). Fluid then exits chamber 100 via outlet opening 104 and travels through a fluid pathway 146 to fluid pathways 74 circumferentially disposed about sidewall casing 54 of second housing section 42 to cool motor 16 (see, for example, FIGS. 3A and 7). Fluid then exits fluid pathways 74 to outlet port 68.

In one example, the fluid pathways of network 34 of fluid pathways forms a continuous fluid pathway through housing 20 such that the components of drive unit 30 are cooled in series (e.g., shaft 46, capacitors 120, power switching network 122, and motor stator 78). In one example, the fluid pathways of shared wall 26 are disposed in series with the fluid pathways of perimeter sidewall 54 of second housing section 42 between inlet and outlet ports 66 and 68. In one example, the fluid pathways of shared wall 26 and perimeter sidewall 54 of second housing section 42 are disposed in series with fluid pathways within hollow end 80 of shaft 46 of electric motor 16.

By employing a single continuous cooling loop, the cooling system is simplified (relative to systems employing parallel pathways), such that the network of fluid pathways 34 of the present disclosure provides high efficiency and requires fewer parts relative to known systems. Additionally, disposing the network of fluid pathways 34 within the confines of housing 20 (i.e., within form factor 44), including disposing inlet and outlet ports 66 and 68 on end cover 52 of first housing section 40 maintains the perimeter of drive unit 30 within the generally longitudinally extending form factor 44 (see FIG. 3A). As described above, such form factor is volumetrically efficient and provides improved ease of installation within electric vehicles (particularly electric powersport vehicles).

It is noted that the network of fluid pathways 34 specifically described herein is for illustrative purposes, and represents only one example implementation of fluid network 34. In the example shown, the fluid pathways 34 travel from an inlet port 66, to the shaft 46, to the channels within the shared wall 26, to the circumferentially disposed pathways 74 in the sidewall casing 54, and finally to the outlet port 68. In other examples, the configuration of the fluid pathways of fluid network 34 and the order in which components are cooled may be different from that illustrated herein. In another example, the fluid pathways 34 may travel from an inlet port 66, to the channels within the shared wall 26, to the shaft 46, to the circumferentially disposed pathways 74 in the sidewall casing 54, such that the inverter 18 components are cooled prior to the motor components. For example, fluid network 34 may be implemented such that thermal transfer fluid is first directed to cool DC capacitors 120 of inverter 18, as such capacitors may have a narrow thermal tolerance. Any number of configurations are possible. Further, one or more pathways in the network of fluid pathways may be omitted in some examples. For example, a network of fluid pathways may omit fluid pathways in shaft 46. The fluid pathways may travel from an inlet port 66, to the channels within the shared wall 26, to the circumferentially disposed pathways 74 in the sidewall casing 54, and finally to the outlet port 68.

Housing 20 may be made, in whole or in part, from metals, metal alloys, composites and/or plastics. Similarly, the channels/pathways of fluid network 34 may be made, in whole or in part, from metals, metal alloys, composites and/or plastics. It is further noted that the components of housing 20, including the channels/pathways of fluid network 34 may be manufactured according to any know technique, including machining, casting, and 3D-printing, for example.

In one example, the form factor 44 of the housing 20 of the drive unit 30 that is suitable for a powersport vehicle 10 may have a length of 10 cm to 30 cm and a diameter or width of 20 cm to 30 cm. In one example, the thickness of the shared wall 26 may be between 3 mm and 8 mm, which provides a sufficient thickness to accommodate channel 144 and chamber 100. It should be understood that the form factor 44 and shared wall 26 thickness may have any suitable dimensions, and that these dimensions may vary depending on the application and power requirements of the drive unit 30.

Figure 11:
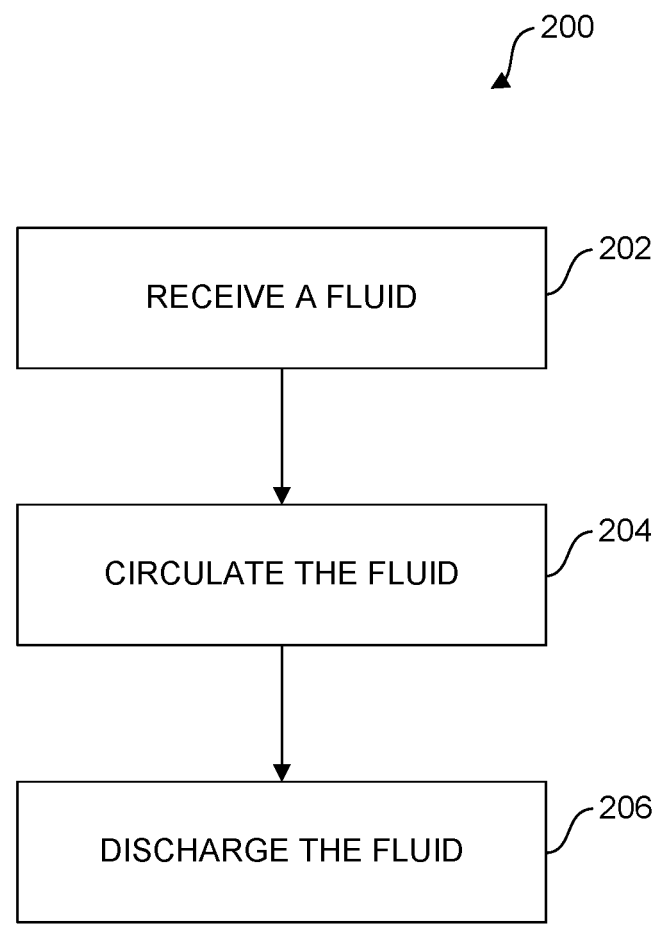
FIG. 11 is a flow diagram illustrating a method according to one example of the present disclosure.

FIG. 11 is a flow diagram illustrating a method 200 for cooling components of a drive unit, according to one example of the present disclosure. The method 200 may be performed by a drive unit housing such as housing 20, for example. Block 202 includes receiving a fluid via an inlet port of the housing. For example, block 202 may include inlet 66 receiving a fluid. Block 204 includes circulating the fluid. In some examples, the fluid is circulated through fluid pathways formed in the housing to cool an electrical inverter and/or an electrical motor. For example, block 204 may include circulating the fluid through fluid pathways formed in a shared wall (e.g., shared wall 26) of the housing to cool the electrical inverter. The shared wall may separate a first compartment of the housing in which the electrical inverter is disposed and a second compartment of the housing in which the electric motor is disposed. Alternatively or additionally, block 204 may include circulating the fluid through fluid pathways formed in a perimeter sidewall of the housing (e.g., perimeter sidewall casing 54) to cool the electric motor. Alternatively or additionally, block 204 may include circulating the fluid through fluid pathways formed in a rotor shaft (e.g., shaft 46) of the electric motor to cool the electric motor. Block 206 includes discharging the fluid via an outlet port of the housing, such as outlet port 68, for example.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

Example embodiments of the present disclosure will now be provided.

Example embodiment 1: A drive unit for an electric vehicle comprising:

a housing having a first compartment and a second compartment separated from one another by a shared wall; an electrical inverter disposed within the first compartment and having a set of electrical output terminals; an electric motor disposed within the second compartment and having electrical input terminals electrically coupled to the output terminals via one or more openings extending through the shared wall.

Example embodiment 2: The drive unit of example embodiment 1, the input terminals of the electric motor comprising electrical leads extending through the one or more openings into the first compartment.

Example embodiment 3: The drive unit of example embodiment 1, a perimeter of the housing being confined within a generally longitudinal form factor, the first and second compartments being disposed axially to one another along an axis of the longitudinal form factor.

Example embodiment 4: The drive unit of example embodiment 3, the longitudinal form factor being generally cylindrical in shape.

Example embodiment 5: The drive unit of example embodiment 1, the inverter including a set of solid-state switches providing electrical power to the electrical output terminals, the switches and output terminals disposed within the first compartment such that the set of output terminals axially aligns with the electrical input terminals of the electric motor to minimize conductor lengths between the electric motor and the set of solid-state switches.

Example embodiment 6: The drive unit of example embodiment 5, the electrical output terminals arrayed along an arc to axially align with the electrical input terminals.

Example embodiment 7: The drive unit of example embodiment 5, the inverter including a set of capacitors to receive DC power from a battery source, the capacitors laterally offset in a radial direction of the cylindrical form factor from the set of solid state switches.

Example embodiment 8: A drive unit housing for an electric vehicle comprising: a first housing section defining a first compartment to house an electrical inverter; and a second housing section defining a second compartment to house an electric motor, the first and second housing sections separably coupled to one another with the first and second compartments separated by a shared wall.

Example embodiment 9: The drive unit housing of example embodiment 8, the first housing section including the shared wall.

Example embodiment 10: The drive unit housing of example embodiment 8, wherein perimeters of the first and second housing sections are confined within a generally longitudinal form factor with the first and second housing sections being disposed axially to one another along an axis of the longitudinal form factor.

Example embodiment 11: The drive unit housing of example embodiment 10, the axis of the longitudinal form factor aligned with an axis of a rotor shaft of the electric motor when disposed within the second compartment.

Example embodiment 12: The drive unit housing of example embodiment 8, the first housing section including: a tubular perimeter casing defining a circumference of the first compartment and having first and second open ends; the shared wall coupled to and closing the first open end; and a cover plate separably coupled to the tubular perimeter casing to cover the second open end.

Example embodiment 13: The drive unit housing of example embodiment 12, the shared wall and the tubular perimeter casing comprising a contiguous piece.

Example embodiment 14: The drive unit housing of example embodiment 12, the cover plate including electrical terminals for connection to the inverter unit from a battery system.

Example embodiment 15: The drive unit housing of example embodiment 8, the second housing section including: a tubular perimeter casing defining a circumference of the second compartment and having first and second open ends; and a cover plate coupled to and closing the first end.

Example embodiment 16: The drive unit housing of example embodiment 15, the shared wall closing the second end when the tubular perimeter casing is coupled thereto.

Example embodiment 17: The drive unit housing of example embodiment 8, the shared wall including a bearing pocket on a side facing the second compartment to receive an end of a rotor shaft of the electric motor.

Example embodiment 18: The drive unit housing of example embodiment 8, the first compartment including a first compartment portion to house capacitors of the inverter and a second compartment portion to house power switching and control electronics of the inverter.

Example embodiment 19: The drive unit housing of example embodiment 8, the shared wall including one or more openings extending there through to provide electrical connection of the electric motor to the electrical inverter.

Example embodiment 20: The drive unit housing of example embodiment 19, wherein electrical power leads from a stator of the electric motor pass through the one or more openings from the second compartment to the first compartment.

Example embodiment 21: A drive unit housing for an electric vehicle comprising: a first housing section having perimeter sidewalls forming a first compartment to house an electrical inverter; and a second housing section having perimeter sidewalls forming a second compartment to house an electric motor, the first compartment separated from the second compartment by a shared wall, the shared wall including fluid pathways to circulate fluid to cool the electrical inverter and the perimeter sidewalls of the second housing section including fluid pathways to circulate fluid to cool the electric motor.

Example embodiment 22: The housing of example embodiment 21, the fluid pathways of the shared wall disposed in series with the fluid pathways of the perimeter sidewalls of the second housing section between a fluid inlet port and a fluid outlet port.

Example embodiment 23: The housing of example embodiment 22, the fluid pathways of the shared wall and perimeter sidewalls disposed in series with fluid pathways within a hollow rotor shaft of the electric motor disposed within the second housing section.

Example embodiment 24: The housing of example embodiment 21, a perimeter of the housing being confined within a generally longitudinal form factor, the first and second compartments being disposed axially to one another along an axis of the longitudinal form factor.

Example embodiment 25: The drive unit of example embodiment 24, the longitudinal form factor being generally cylindrical in shape.

Example embodiment 26: The drive unit of example embodiment 21, the first housing section including the shared wall.

Example embodiment 27: The drive unit of example embodiment 21, the first housing section separable from the second housing section.

Example embodiment 28: A drive unit for an electric vehicle comprising: a housing including: a first housing section having perimeter sidewalls forming a first compartment; and a second housing section having a perimeter sidewalls forming a second compartment, the first and second compartments separated from one another by a shared wall; an electrical inverter disposed within the first compartment, the electrical inverter including inverter components mounted to the shared wall; and an electric motor disposed within the second compartment, the shared wall including fluid pathways to circulate fluid to cool the electrical inverter and the perimeter sidewalls of the second housing section including fluid pathways to circulate fluid to cool the electric motor.

Example embodiment 29: The drive unit of example embodiment 28, the electric motor including a hollow rotor shaft having an inlet fluid pathway and an outlet fluid pathway to circulate fluid through the shaft to cool the electric motor, an end of the rotor shaft disposed within a bearing pocket on the shared wall, the inlet and outlet fluid pathways in fluidic communication with fluid pathways of the shared sidewall via the end of the rotor shaft.

Example embodiment 30: The drive unit of example embodiment 29, the fluid pathways of the shared wall, the inlet and output fluid pathways of the rotor shaft, and the fluid pathways of the perimeter sidewalls of the second housing section form a continuous fluid pathway between a fluid inlet port and a fluid outlet port.

Example embodiment 31: The drive unit of example embodiment 30, the electrical inverter including a set of capacitors mounted to the shared wall, the fluid pathways arranged so as to first pass the capacitors downstream of the fluid inlet port.

Example embodiment 32: The drive unit of example embodiment 27, the perimeter sidewalls of the second housing section including a cylindrical housing extending about a perimeter of a stator section of the electric motor, the fluid pathways extending about a circumference of the cylindrical housing.

Example embodiment 33: The drive unit of example embodiment 32, the fluid pathways extending in a spiral fashion about the circumference of the cylindrical housing.

Example embodiment 34: The drive unit of example embodiment 28, a perimeter of the housing being confined within a generally longitudinal form factor, the first and second compartments being disposed axially to one another along an axis of the longitudinal form factor.

Example embodiment 35: The drive unit of example embodiment 34, the longitudinal form factor being generally cylindrical in shape.

Example embodiment 36: A drive unit housing for an electric vehicle comprising: a first housing section having perimeter sidewalls forming a first compartment to house an electrical inverter; and a second housing section having perimeter sidewalls forming a second compartment to house an electric motor, the first compartment separated from the second compartment by a shared wall, the first and second housing sections having perimeters confined within a generally longitudinal form factor and being disposed axially to one another along an axis of the longitudinal form factor; and a continuous fluid pathway extending through the first and second housing sections between an inlet and an outlet port to circulate fluid to cool the electrical inverter and the electric motor.

Example embodiment 37: The drive unit housing of example embodiment 36, the continuous fluid pathway including a portion disposed in the shared sidewall.

Example embodiment 38: The drive unit housing of example embodiment 36, the continuous fluid pathway in series with a fluid pathway within a hollow rotor shaft of the electric motor.

Example embodiment 39: The drive unit housing of example embodiment 38, the continuous fluid pathway in fluid communication with the fluid pathway within the hollow rotor shaft via a portion of the fluid pathway disposed within the shared wall.

Example embodiment 40: The drive unit of example embodiment 36, the continuous fluid pathway including a spiral pathway disposed about a perimeter of the second housing section to cool the electric motor.

The invention claimed is:

1. A drive unit for an electric vehicle comprising:
   a housing having a first compartment and a second compartment separated from one another by a shared wall, a perimeter of the housing being confined within a generally longitudinal form factor, the first and second compartments being disposed axially to one another along a longitudinal axis of the longitudinal form factor;
   an electrical inverter disposed within the first compartment and having a set of electrical output terminals; and
   an electric motor disposed within the second compartment and having electrical input terminals electrically coupled to the electrical output terminals via one or more openings extending through the shared wall;
   wherein the electrical output terminals are disposed within the first compartment such that the set of output terminals axially aligns with the electrical input terminals of the electric motor to reduce conductor lengths between the electric motor and the electrical inverter.

2. The drive unit of claim 1, the input terminals of the electric motor comprising electrical leads extending through the one or more openings into the first compartment.

3. The drive unit of claim 1, the longitudinal form factor being generally cylindrical in shape.

4. The drive unit of claim 1, the electrical inverter including a set of solid-state switches providing electrical power to the electrical output terminals.

5. The drive unit of claim 1, the electrical output terminals arrayed along an arc to axially align with the electrical input terminals.

6. The drive unit of claim 1, the electrical inverter including a set of capacitors to receive DC power from a battery source, the capacitors offset in a radial direction of the longitudinal form factor from the set of solid-state switches.

7. A drive unit housing for an electric vehicle comprising:
   a first housing section defining a first compartment to house an electrical inverter, the first compartment including a first compartment portion to house capacitors of the electrical inverter and a second compartment portion to house power switching and control electronics of the electrical inverter; and
   a second housing section defining a second compartment to house an electric motor, the first and second housing sections separably coupled to one another with the first and second compartments separated by a shared wall.

8. The drive unit housing of claim 7, wherein perimeters of the first and second housing sections are confined within a generally longitudinal form factor with the first and second housing sections being disposed axially to one another along a longitudinal axis of the longitudinal form factor.

9. The drive unit housing of claim 8, the longitudinal axis of the longitudinal form factor aligned with an axis of a rotor shaft of the electric motor when disposed within the second compartment.

10. The drive unit housing of claim 7, the first housing section including:
    a substantially tubular perimeter casing defining a circumference of the first compartment and having first and second open ends;
    the shared wall coupled to and closing the first open end; and
    a cover plate separably coupled to the tubular perimeter casing to cover the second open end.

11. The drive unit housing of claim 10, the shared wall and the tubular perimeter casing comprising a contiguous piece.

12. The drive unit housing of claim 10, the cover plate including electrical terminals for connection to the electrical inverter from a battery system.

13. The drive unit housing of claim 7, the second housing section including:
    a substantially tubular perimeter casing defining a circumference of the second compartment and having first and second open ends; and
    a cover plate coupled to and closing the first end.

14. The drive unit housing of claim 13, the shared wall closing the second end when the tubular perimeter casing is coupled thereto.

15. The drive unit housing of claim 7, the shared wall including a bearing pocket on a side facing the second compartment to receive an end of a rotor shaft of the electric motor.

16. The drive unit housing of claim 7, the shared wall including one or more openings extending there through to provide electrical connection of the electric motor to the electrical inverter.

17. The drive unit housing of claim 16, wherein electrical power leads from a stator of the electric motor pass through the one or more openings from the second compartment to the first compartment.

18. An electric vehicle comprising:
a battery system;
an electrical inverter electrically coupled to the battery system;
an electric motor, electrically coupled to the power inverter, to propel the electric vehicle; and
a housing having a first compartment to house the power inverter and a second compartment to house the electric motor, the first compartment including a first compartment portion to house capacitors of the electrical inverter and a second compartment portion to house power switching and control electronics of the electrical inverter, the first compartment and second compartment being separated by a shared wall.

* * * * *